United States Patent [19]

Beyer et al.

[11] Patent Number: 5,264,387
[45] Date of Patent: Nov. 23, 1993

[54] METHOD OF FORMING UNIFORMLY THIN, ISOLATED SILICON MESAS ON AN INSULATING SUBSTRATE

[75] Inventors: Klaus D. Beyer, Poughkeepsie; Mark A. Jaso; Subramanian S. Iyer, both of Yorktown Heights; Scott R. Stiffler, Brooklyn; James D. Warnock, Mohegan Lake, all of N.Y.

[73] Assignee: International Business Machines Corporation, Armonk, N.Y.

[21] Appl. No.: 966,959

[22] Filed: Oct. 27, 1992

[51] Int. Cl.$^5$ .......................................... H01L 21/302
[52] U.S. Cl. ...................................... 437/62; 156/636; 156/649
[58] Field of Search ................... 156/636, 649; 437/62

[56] References Cited

U.S. PATENT DOCUMENTS

| | | | |
|---|---|---|---|
| 4,662,986 | 5/1987 | Lim | 156/649 |
| 4,735,679 | 4/1988 | Lasky | 156/636 |
| 4,755,481 | 7/1988 | Faraone | 437/62 |
| 4,842,675 | 6/1989 | Chapman et al. | 437/62 |
| 4,927,781 | 5/1990 | Miller | 156/649 |
| 5,084,407 | 1/1992 | Boland et al. | 437/62 |
| 5,177,028 | 1/1993 | Manning | 437/41 |

Primary Examiner—Brian E. Hearn
Assistant Examiner—Laura M. Holtzman
Attorney, Agent, or Firm—Jeffrey L. Brandt

[57] ABSTRACT

A method comprising the steps of: providing a substrate including an insulator material having a generally planar surface; forming a plurality of mesas of a semiconductor material on the substrate surface, the plurality of mesas spaced by channels extending to the substrate surface, the plurality of mesas including device mesas and dummy mesas; forming a polish-stop structure of at least one selected material over the substrate surface in the channels; polishing the plurality of mesas and stopping on the polish-stop structure whereby the plurality of mesas have the same thickness as the polish-stop structure; and replacing the dummy mesas with an insulator material whereby to electrically isolate the device mesas.

12 Claims, 4 Drawing Sheets

METHOD OF FORMING UNIFORMLY THIN, ISOLATED SILICON MESAS ON AN INSULATING SUBSTRATE

CROSS REFERENCE TO RELATED APPLICATONS

The present invention is related to copending patent application Ser. No. 07/876,598, titled "Method of Forming Thin Silicon Mesas Having Uniform Thickness," filed Apr. 30, 1992, by Ogura, S., Rovedo, N., and Doerre, G.W., and assigned to the same assignee as the present application. Ogura et al. is directed to the formation of silicon mesas on an insulator using polish-resistant silicon nitride in large wiring-channel spaces between the silicon mesas.

BACKGROUND OF THE INVENTION

The present invention relates generally to the formation of multilayer structures and more particularly to the formation of isolated semiconductor mesas on an insulating substrate.

In the manufacture of complementary field effect transistors, commonly known as CMOS devices, it is desirable to provide a highly isolated device region wherein each device is formed. In the past, such device regions were formed in a common silicon substrate, with electrical isolation provided within the substrate through selective doping or oxidation of substrate regions.

More recently, it has become known to form small silicon device regions over an insulating substrate such as silicon dioxide. Insulating material is formed intermediate the silicon device regions to complete the electrical isolation therebetween, and CMOS devices are formed within the isolated silicon device regions.

This structure, known as silicon-on-insulator (SOI), results in highly isolated device regions and hence highly isolated, high-performance CMOS devices. CMOS devices formed using SOI structures tend to have very low parasitic capacitance, and good immunity from latch-up. Minimizing parasitic capacitance and increasing latch-up immunity greatly improves the operating characteristics of the CMOS devices and circuits formed therefrom.

In forming these SOI device regions, it is necessary to make them of a uniform thickness, generally in the range of 20–100 nm, with a thickness variation not greater than about 5–10%. Greater variations in thickness result not only in varying device characteristics, but also make follow-on processing, such as stud formation, more difficult.

In addition to the uniform thickness of the SOI device regions, the insulating material disposed between the SOI device regions must have good integrity. That is, it must conform well to the underlying substrate and to the sides of the device regions, minimizing electrical leakage.

One recognized problem in the art is that of polishing the silicon device regions down to the necessary thin, uniform height. U.S. Pat. No. 4,735,679 to Lasky, assigned to the assignee of the present invention, shows a method of forming SOI structures wherein a thin, tungsten polish-stop layer is disposed in the channels between the silicon mesas. The silicon mesas are then polished, using a chemical-mechanical polishing process selective to the silicon over the tungsten, stopping on the tungsten layer. The tungsten is removed to permit further processing of devices within the silicon mesas.

While various processes are known for forming SOI structures, it is still quite difficult to provide such structures having uniformly thin silicon device regions. It is further difficult to form such SOI structures wherein the electrical isolation formed by the insulator material between the silicon device regions is adequate to minimize leakage current.

SUMMARY OF THE INVENTION

One object of the present invention is to provide a method for forming semiconductor-over-insulator structures having thin, uniform thickness semiconductor mesas.

Another object of the present invention is to provide a method for forming a semiconductor-over-insulator structure having a high degree of electrical isolation between the semiconductor mesas.

Yet another object of the present invention is to provide a method for forming a semiconductor-over-insulator structure having very low electrical leakage between the semiconductor mesas. A further object of the present invention is to provide a method for forming a semiconductor-over-insulator structure having very low parasitic source-to-drain leakage.

Yet a further object of the present invention is to provide a semiconductor-over-insulator structure having the above-described characteristics and capable of cost-effective manufacture using available semiconductor processing techniques, processes, and equipment.

In accordance with the present invention, there is provided a method comprising the steps of: providing a substrate including an insulator material having a generally planar surface; forming a plurality of mesas of a semiconductor material on the substrate surface, the plurality of mesas spaced by channels extending to the substrate surface, the plurality of mesas including device mesas and dummy mesas; forming a polish-stop structure of at least one selected material over the substrate surface in the channels; polishing the plurality of mesas and stopping on the polish-stop structure whereby the plurality of mesas have the same thickness as the polish-stop structure; and replacing the dummy mesas with an insulator material whereby to electrically isolate the device mesas.

BRIEF DESCRIPTION OF THE DRAWINGS

These and other objects, features, and advantages of the present invention will become apparent from a consideration of the following detailed description of the invention, including the drawing Figures, wherein.

DETAILED DESCRIPTION OF THE INVENTION

Figure 1:
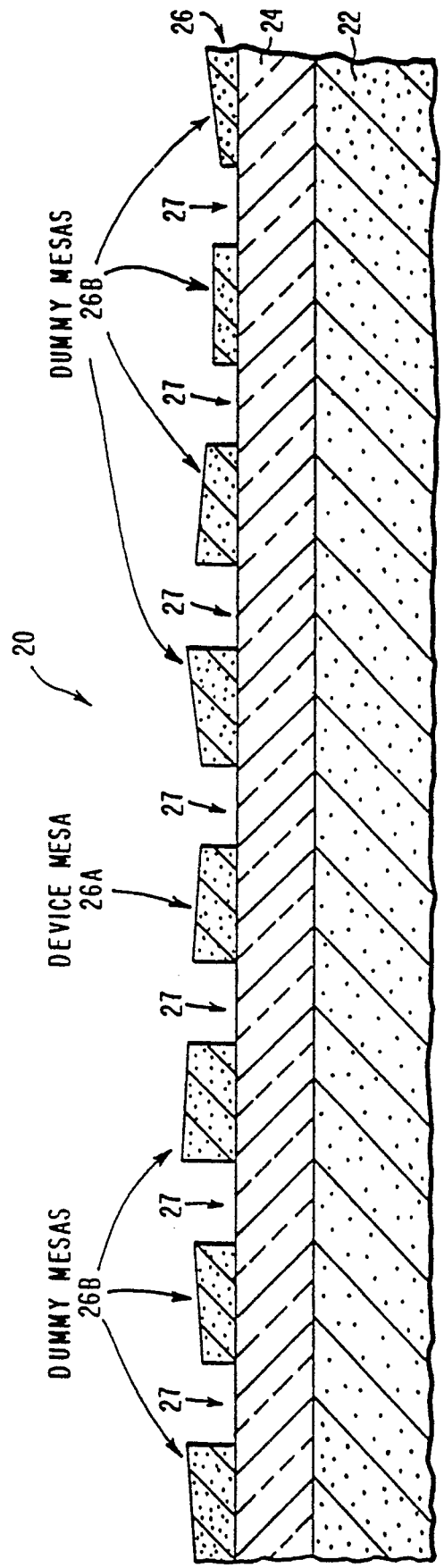
FIG. 1 is a cross-sectional view of a SOI substrate including a silicon device mesa and silicon dummy mesas in accordance with the present invention.

Referring now to the drawings, FIG. 1 shows a silicon-on-insulator (SOI) structure 20 including a silicon substrate 22. A layer 24 of insulator material, in the present illustration silicon dioxide, is disposed over the upper surface of substrate 22. A patterned layer 26 of semiconductor material, in the present illustration monocrystalline silicon, is disposed on the upper surface of insulator layer 24. In accordance with the present invention, silicon layer 26 has been patterned to provide a device region or mesa 26A, and multiple, adjoining dummy mesas indicated as 26B. Channels 27, extending downward through the mesas to the upper surface of insulator layer 24, space device and dummy mesas 26A, 26B.

In practice, basic SOI structures can be purchased commercially, the basic structure including a silicon substrate such as 22, a bonded insulator layer such as silicon dioxide layer 24, and a monocrystalline silicon layer such as layer 26. Insulator layer 24 has a very uniform thickness, in the range of 100–1,000 nm±5%, with a very planar upper surface. Silicon layer 26, due to the nature of the process used to form it, is less uniform in thickness. For example, silicon layer 26 may have a nominal thickness of 2.0 microns with a variation of ±0.5 micron.

To provide structure 20 shown in FIG. 1, silicon layer 26 is patterned using conventional photoresist masking and anisotropic etching. A conventional photoresist mask is first formed so as to expose the regions wherein channels 27 are to be etched. An etchant selective to silicon layer 26 over insulator layer 24 is utilized so that the etch process is not highly time sensitive. For example, a Reactive Ion Etching (RIE) process, utilizing a dry etchant such as $Cl_2$, or HCl, or HBr can be used to selectively etch silicon layer 26 and stop on silicon dioxide layer 24. FIG. 1 has been purposely drawn to illustrate the non-uniformities in the thicknesses of the resulting mesas 26A, 26B.

In practice it will be understood that there are many device mesas 26A on SOI structure 20, a CMOS integrated circuit chip typically having up to 80 percent of the chip populated with CMOS devices. It is thus necessary, in accordance with the Background of the Invention described above, to planarize all device regions 26A to a uniform thickness. A typical, desirable thickness for device mesa 26A to support a high-performance CMOS device is selected to be 80 nm. It will be understood that different thicknesses can be selected for different purposes.

It is thus necessary to planarize device mesas 26A from their initial thickness of roughly 2,000 nm down to a uniform thickness of 80 nm. In accordance with the present invention, and as will be described in further detail below, dummy mesas 26B are utilized as a key part of the process of the present invention.

For purposes of illustrating the present invention, FIGS. 2–7 show an enlarged region around device mesa 26A. It will be understood that the processes described operate on the entirety of the upper surface of SOI structure 20.

Figure 2:
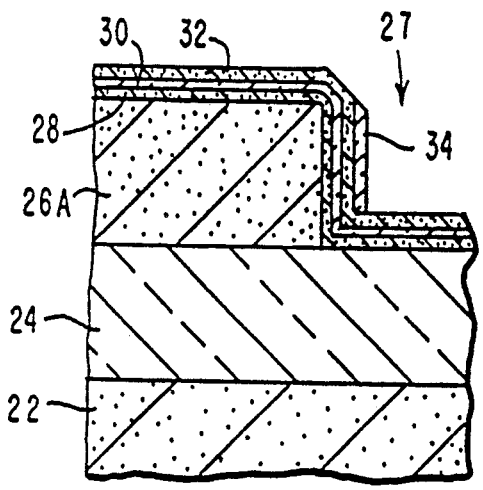
FIGS. 2–7 are cross-sectional views, of one side of one mesa from FIG. 1, showing consecutive steps of a polishing process in accordance with the present invention.

Referring now to FIG. 2, a layer 28 of polycrystalline silicon (polysilicon) is deposited conformally over the structure to a thickness of 40 nm. Polysilicon layer 28 is formed using a conventional chemical vapor deposition (CVD) process with silane ($SiH_4$).

Layers 30 and 32, of silicon nitride and polysilicon, respectively, are deposited conformally and sequentially over polysilicon layer 28. Silicon nitride layer 30 is formed to a thickness of 40 nm using a conventional CVD process such as $SiCl_2H_2 + NH_3$. Polysilicon layer 32 is formed to a thickness of about 100 nm using the polysilicon CVD process described herein above.

Still with reference to FIG. 2, a layer of silicon nitride (not shown) is deposited conformally over polysilicon layer 32 to a thickness of 60 nm, using the above-described silicon nitride CVD process. This last silicon nitride layer is anisotropically etched, selective to polysilicon, using, for example, a dry RIE process with a $CHF_3/O_2$ etchant, to leave silicon nitride sidewall 34.

Figure 3:
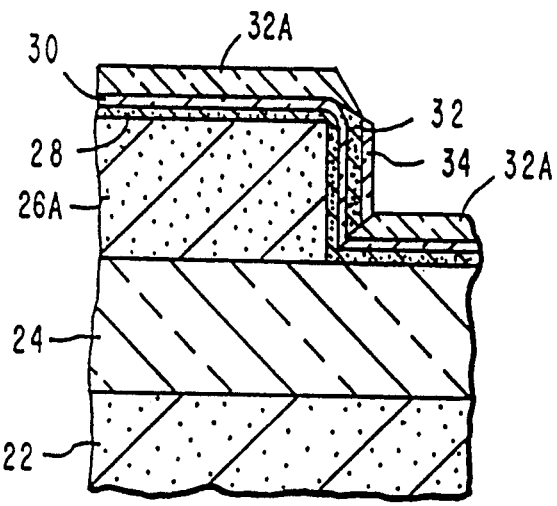

Referring now to FIG. 3, the structure is exposed to an oxidizing environment whereby to convert the unprotected regions of polysilicon layer 32 entirely to silicon dioxide 32A. The oxidizing environment can comprise, for example, a steam environment of oxygen plus water. With layer 32 originally formed to the above-noted thickness, oxidized regions 32A will have a very uniform thickness of about 2.2 times the thickness of the unconverted polysilicon, or 220 nm.

Figure 4:
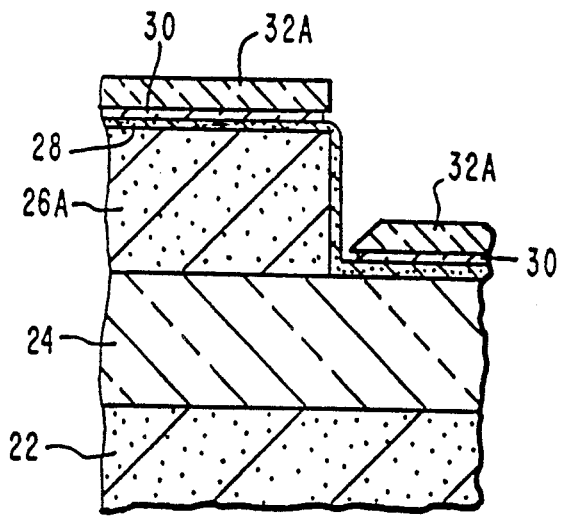

Referring now to FIG. 4, a wet etch selective to silicon nitride over silicon dioxide and polysilicon is used to remove silicon nitride sidewall 34. The etch can comprise, for example, $H_3PO_4$. Next, a dry etch selective to polysilicon over silicon dioxide and silicon nitride is used to remove the unprotected regions of polysilicon layer 32, these unprotected regions being exposed by the removal of silicon nitride sidewall 34. This etch can comprise a dry process using $SF_6$ plasma. The exposed sidewall of silicon nitride layer 30 on device mesa 26A is removed with a wet etch selective to the silicon nitride over silicon dioxide, for example $H_3PO_4$. The resulting structure is shown in FIG. 4.

Figure 5:
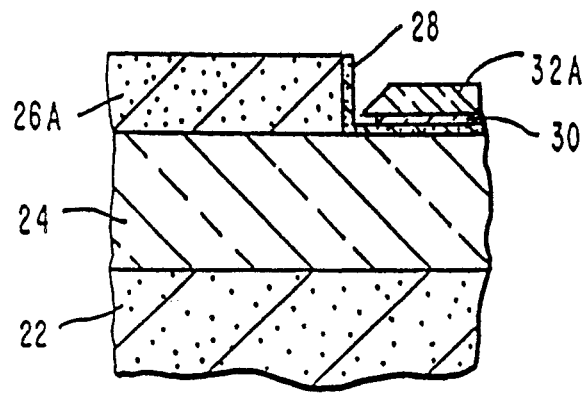

With reference now to FIG. 5, a non-selective polish is used to remove the layers of silicon dioxide 32A, silicon nitride 30, and polysilicon 28 on the uppermost surface of device and dummy mesas 26A, 26B. This polish can be performed using a chemical-mechanical (chem-mech) polishing process with a KOH-stabilized colloidal silica solution. This polish step may also remove some upper portion of mesas 26A, 26B, but is stopped before reaching silicon dioxide layer 32A within channels 27. The resulting structure is shown in FIG. 5.

It will thus be apparent that, in the non-selective polish step described above, dummy mesas 26B function to protect what will become the polish-stop layers 30 and 32A within channels 27.

Figure 6:
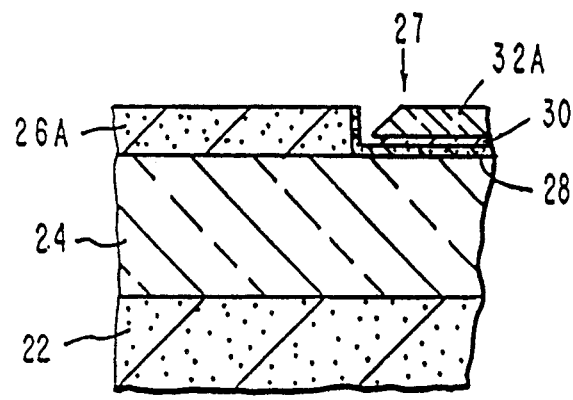

Referring now to FIG. 6, a first selective polish is performed to remove the upper portions of dummy and silicon mesas 26A, 26B, stopping on the upper surface of silicon dioxide polish-stop layer 32A within channel 27. This selective polish preferably comprises a chem-mech process utilizing an $NH_4OH$-stabilized colloidal silica slurry. It is noted that mesas 26A, 26B now have a thickness (or height) equal to the combined thicknesses of layers 28, 30, 32A within channel 27, or 300 nm. Due to the inclusion of dummy mesas 26B on the structure, the thickness of the dummy and device mesas is highly uniform. In fact, limited experimentation has indicated that it is possible to control the uniformity of the thickness of the mesas 26A, 26B in the process described above to within approximately ±15 nm.

At this point, should it be desired to maintain selected device or dummy mesas 26A or 26B at the above-described thickness, then the portion of the structure containing these selected devices is protectively masked. This masking is done using conventional photolithographic processing techniques to form a resist mask. The structure is otherwise processed in accordance with the steps set out below.

Figure 7:
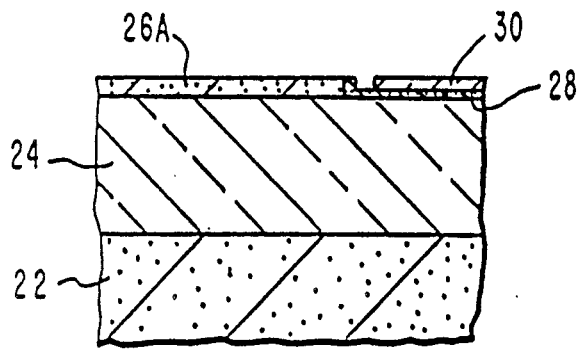

With reference now to FIG. 7, first polish-stop layer 32A is removed selectively to exposed silicon regions 26A, 26B and underlying silicon nitride polish-stop layer 30. This removal is performed, for example, using an HF solution. A second selective polish is then performed using a polishing process selective to silicon over silicon nitride. Mesas 26A, 26B are thus polished downward, through the thickness of polish-stop layer 32A, to the second polish-stop of silicon nitride layer 30 within channel 27. This second polish is preferably performed using a chem-mech polishing process with a $NH_4OH$-stabilized colloidal silica slurry. It will be noted that the thickness of mesas 26A, 26B is now the combined thickness of polysilicon layer 28 and silicon nitride layer 30 within channel 27, or 80 nm. Limited experimentation has indicated that, using the process including dummy mesas 26B and the second selective polishing step described above, it is possible to control the uniformity of the thickness of all of the mesas to approximately ±3.0 nm.

Should any regions of the structure contain photoresist masking whereby to maintain selected dummy and device mesas at the greater thickness described with respect to FIG. 7 above, this photoresist masking is removed in a conventional manner. Any masked mesas will, of course, maintain the above-described, thicker, uniform dimensions, thereby leaving both thicker and thinner mesas on the structure.

It will be appreciated from a consideration of the above that the resulting thickness of mesas 26A, 26B can be controlled to substantially the same tolerance as the thicknesses of the polish-stop layers deposited within channels 27. It will thus be obvious that this is a highly controllable process.

Figure 8:
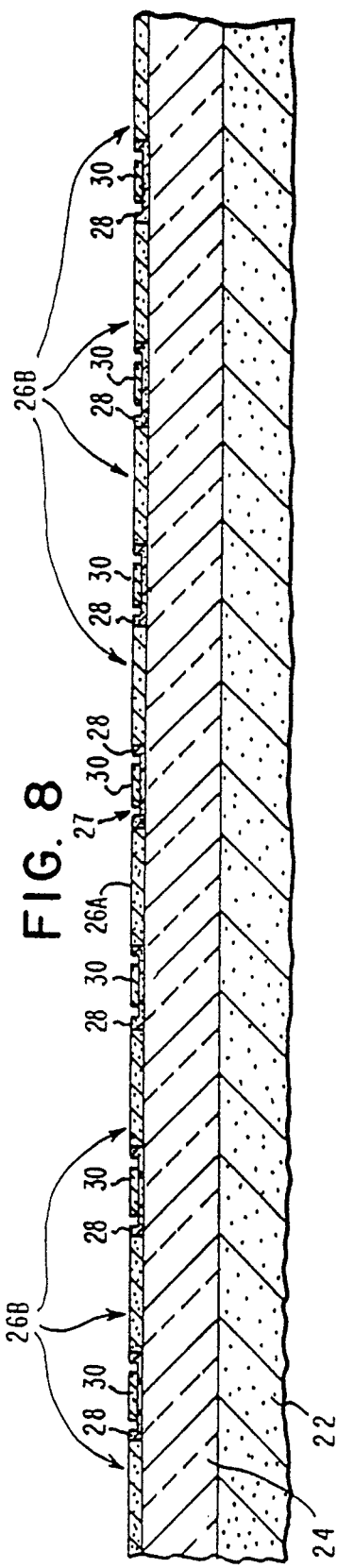
FIG. 8 is a cross-sectional view of the SOI structure of FIG. 1 having the mesas planarized in accordance with the process shown in FIGS. 2–7.

Referring now to FIG. 8, SOI structure 20 of FIG. 1 is shown having undergone the processing and polishing steps described with respect to FIGS. 2-7. Dummy and device mesas 26B, 26A, respectively, are seen to be planarized to the uniform thickness described above. Polysilicon layer 28 and overlying silicon nitride layer 30 remain in the channels 27 intermediate the mesas 26A, 26B.

Figure 9:
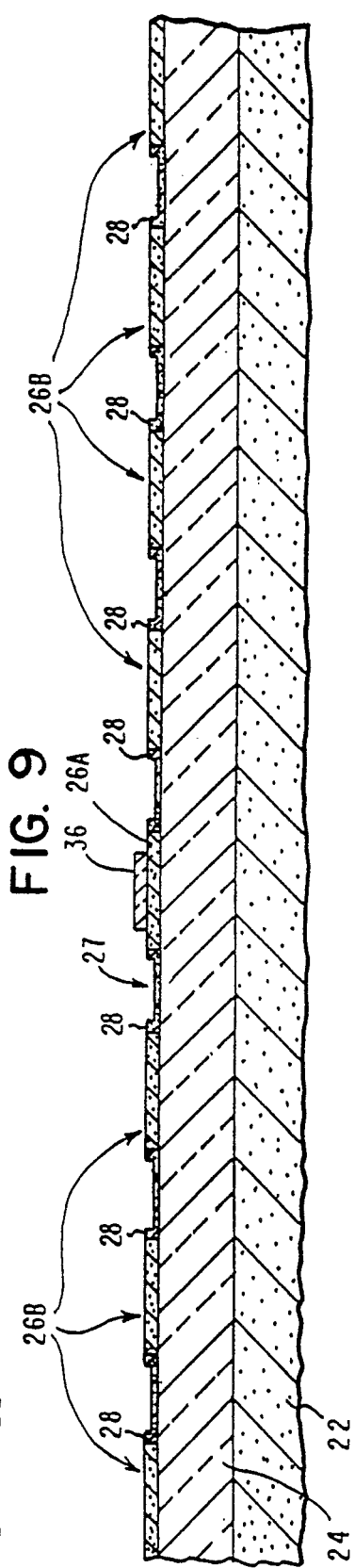
FIG. 9 is a cross-sectional view of the SOI structure of FIG. 8 showing further processing of the polish-stop layers and device mesa.

With reference now to FIG. 9, an etch selective to silicon nitride over silicon and polysilicon, for example a wet etch such as $H_3PO_4$, is used to remove remaining portions of silicon nitride layer 30 in channels 27. Polysilicon layer 28 is thus exposed to the ambient environment. A protective mask 36 of silicon nitride is formed over device mesa 26A, covering what is to become the active device region of the mesa. Mask 36 is formed using conventional photoresist masking techniques to expose only device mesa 26A, and the silicon nitride CVD process described above. It will be apparent from a consideration of FIG. 9 that mask 36 covers an area of device mesa 26A which is slightly smaller than, and contained within, the device mesa upper surface.

Figure 10:
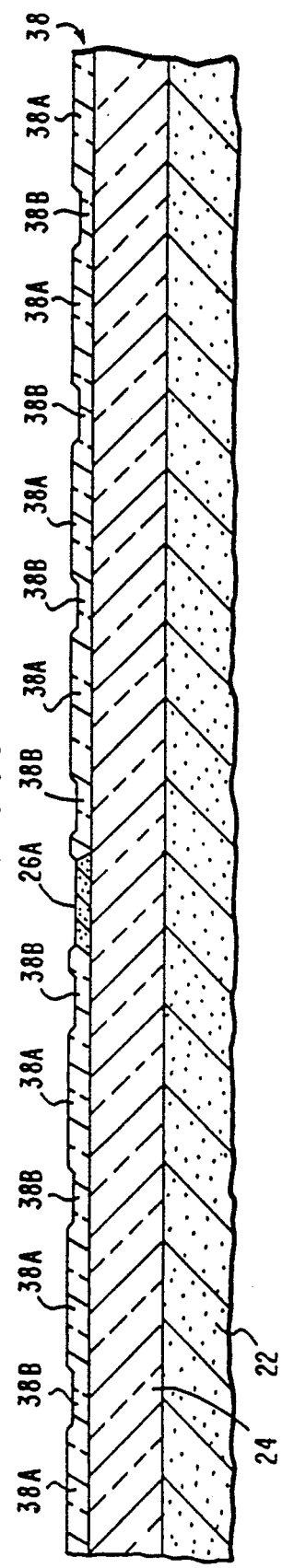
FIG. 10 is a cross-sectional view of a SOI structure completed in accordance with the process of the present invention.

Considering now FIG. 10, in accordance with a key aspect of the present invention, the structure of FIG. 9, including dummy mesas 26B and remaining polysilicon layer portions 28, is exposed to an oxidizing environment. This environment can comprise, for example, a steam environment of oxygen plus water.

Dummy mesas 26B, remaining polysilicon layer portions 28, and the unmasked edges of device region 26A are thus converted to a layer 38 of insulating silicon dioxide. The converted dummy mesas are indicated at 38A, while the converted polysilicon layer regions are indicated at 38B. Device mesa 26A is thus electrically isolated from other surrounding, identical device mesas.

Further, in accordance with the process described above, the active device mesa 26A shown in the completed structure of FIG. 10, is slightly smaller than the device mesa shown in the previous FIGS. This is due to the size of mask 36 as described above and, the present inventors have discovered, results in CMOS devices having substantially reduced source-to-drain leakage current.

The present method of converting dummy mesas 26B and polysilicon layer portions 28 to an integral silicon dioxide layer results in isolated device mesa 26A having extremely low mesa-to-mesa leakage current.

The structure shown in FIG. 10 is then used to support active semiconductor devices, such as CMOS devices, in the device mesas 26A. Many different processes and structures are known to those skilled in the art for forming such active semiconductor devices.

There is thus provided a method for forming SOI structures wherein the silicon device regions/mesas exhibit a highly uniform thickness, and a high degree of electrical isolation. The process uses dummy mesas, in combination with highly controllable polish-stop layers, to precisely control a selective polishing process to yield the uniform thickness. The conversion of the dummy mesas and remaining portions of the polish-stop layers to an insulator results in an insulating structure of high integrity and low leakage current.

The present invention has application in the formation of integrated circuits, particularly in the formation of substrates to support large scale CMOS integrated circuits.

While the invention has been shown and described with respect to specific embodiments, it is not thus limited. Numerous modifications, changes, and improvements falling within the scope of the present invention will occur to those skilled in the art.

What is claimed is:

1. A method comprising the steps of:
   providing a substrate including an insulator material having a generally planar surface;
   forming a plurality of mesas of a semiconductor material on said substrate surface, said plurality of mesas spaced by channels extending to said substrate surface, said plurality of mesas including device mesas and dummy mesas;
   forming a polish-stop structure of at least one selected material over said substrate surface in said channels;
   polishing said plurality of mesas and stopping on said polish-stop structure whereby said plurality of mesas have the same thickness as said polish-stop structure; and
   replacing said dummy mesas with an insulator material whereby to electrically isolate said device mesas.

2. A method in accordance with claim 1 wherein said step of replacing said dummy mesas with an insulator material comprises converting said dummy mesas to said insulator material.

3. A method in accordance with claim 2 wherein said step of converting said dummy mesas to said insulator material further includes the step of simultaneously converting at least a portion of said polish-stop structure to said insulator material, whereby the converted dummy mesas and converted portion of said polish-stop structure form an integral layer of said insulator material.

4. A method in accordance with claim 3 wherein said converting step comprises exposing said dummy mesas and said portion of said polish-stop layer to an oxidizing environment to convert said dummy mesas and said portion of said polish-stop structure to an oxide insulator.

5. A method in accordance with claim 1 wherein said step of forming a polish-stop structure comprises the steps of:
   forming a conformal layer of said at least one selected material over said substrate and said plurality of mesas;
   said conformal layer of said at least one selected material having a thickness less than the thickness of said plurality of mesas; and
   removing said conformal layer of said at least one selected material from the top and side surfaces of said plurality of mesas, leaving said conformal layer of at least one selected material on the surface of said substrate within said channels.

6. A method in accordance with claim 4 wherein said step of converting said dummy mesas and said portion of said polish-stop structure to an insulator material includes the step of forming a protective layer of an oxidation-resistant material over said device mesas, thereby inhibiting said device mesas from being converted to an oxide.

7. A method in accordance with claim 6 wherein said protective layer is contained within and slightly smaller than the upper surface of said device mesas, whereby the edges of said device mesas are oxidized during said converting step.

8. A method in accordance with claim 1 wherein said step of polishing said plurality of mesas comprises chemically-mechanically polishing said plurality of mesas using polishing materials selective to said plurality of mesas over said polish-stop structure.

9. A method in accordance with claim 4 wherein said step of polishing said plurality of mesas comprises chemically-mechanically polishing said plurality of mesas using polishing materials selective to said plurality of mesas over said polish-stop structure.

10. A method in accordance with claim 2 wherein said step of converting said dummy mesas and said portion of said polish-stop structure to an insulator material further comprises the steps of forming a layer of protective material over said device mesas before performing said converting step.

11. A method in accordance with claim 10 wherein said layer of protective material is contained within and slightly smaller than the upper surface of said device mesas, whereby the edges of said device mesas are oxidized during said converting step.

12. A method in accordance with claim 4 wherein:
   said semiconductor material includes silicon; and
   said polish-stop structure comprises silicon dioxide.

* * * * *